United States Patent
Ando et al.

(10) Patent No.: US 9,679,967 B1
(45) Date of Patent: Jun. 13, 2017

(54) CONTACT RESISTANCE REDUCTION BY III-V GA DEFICIENT SURFACE

(71) Applicant: INTERNATIONAL BUSINESS MACHINES CORPORATION, Armonk, NY (US)

(72) Inventors: Takashi Ando, Tuckahoe, NY (US); Kevin K. Chan, Staten Island, NY (US); John Rozen, Hastings on Hudson, NY (US); Jeng-Bang Yau, Yorktown Heights, NY (US); Yu Zhu, Rye Brook, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/282,152

(22) Filed: Sep. 30, 2016

(51) Int. Cl.
*H01L 29/08* (2006.01)
*H01L 21/265* (2006.01)
(Continued)

(52) U.S. Cl.
CPC ...... *H01L 29/0847* (2013.01); *H01L 21/0257* (2013.01); *H01L 21/02241* (2013.01);
(Continued)

(58) Field of Classification Search
None
See application file for complete search history.

(56) References Cited

U.S. PATENT DOCUMENTS 5,275,971 A * 1/1994 Wu ............ H01L 21/28575
148/DIG. 20
5,317,190 A 5/1994 Fleischman et al.
(Continued)

FOREIGN PATENT DOCUMENTS

CN 1870224 A 11/2006
CN 100452303 C 1/2009
(Continued)

OTHER PUBLICATIONS

English Abstact for KR20030034734A—May 9, 2003; 1 pg.
(Continued)

*Primary Examiner* — Michelle Mandala
(74) *Attorney, Agent, or Firm* — Cantor Colburn LLP; Louis Percello

(57) ABSTRACT

A method for forming a semiconductor device includes forming a III-V semiconductor substrate and forming a gate structure on the III-V semiconductor substrate. The method also includes forming a thin spacer surrounding the gate structure and forming a source/drain junction with a first doped III-V material at an upper surface of the III-V semiconductor substrate. The method also includes oxidizing a surface the source/drain forming an oxidation layer; removing natural oxides from the oxidation layer on a surface of the source/drain to expose ions of the first doped material at least at a surface of the source/drain. The method further includes applying a second doping to the source/drain to increase a doping concentration of the first doped III-V material, forming metal contacts at least at the second doped surface of the source/drain; and then annealing the contact.

19 Claims, 10 Drawing Sheets

(51) Int. Cl.
*H01L 21/266* (2006.01)
*H01L 21/02* (2006.01)
*H01L 21/225* (2006.01)
*H01L 29/207* (2006.01)

(52) U.S. Cl.
CPC .... *H01L 21/02546* (2013.01); *H01L 21/2258* (2013.01); *H01L 21/266* (2013.01); *H01L 21/26546* (2013.01); *H01L 29/207* (2013.01)

(56) References Cited

U.S. PATENT DOCUMENTS

| | | |
|---|---|---|
| 5,358,899 A | 10/1994 | Fleischman et al. |
| 2009/0273010 A1* | 11/2009 | Simoen ............... H01L 21/3228 257/288 |
| 2010/0163847 A1* | 7/2010 | Majhi ............... H01L 21/28518 257/24 |
| 2014/0264362 A1* | 9/2014 | Wang ................. H01L 29/7831 257/76 |

FOREIGN PATENT DOCUMENTS

| | | |
|---|---|---|
| JP | 3407146 B2 | 3/2003 |
| KR | 20030034734 A | 5/2003 |

OTHER PUBLICATIONS

English Abstract for CN1870224A—Nov. 29, 2006 and CN100452303C—Jan. 14, 2009; 1 pg.
English Abstract for JP3407146B2—Mar. 14, 2003.
English Abstract for KR100438890B1—204-07-02; 1 pg.

\* cited by examiner

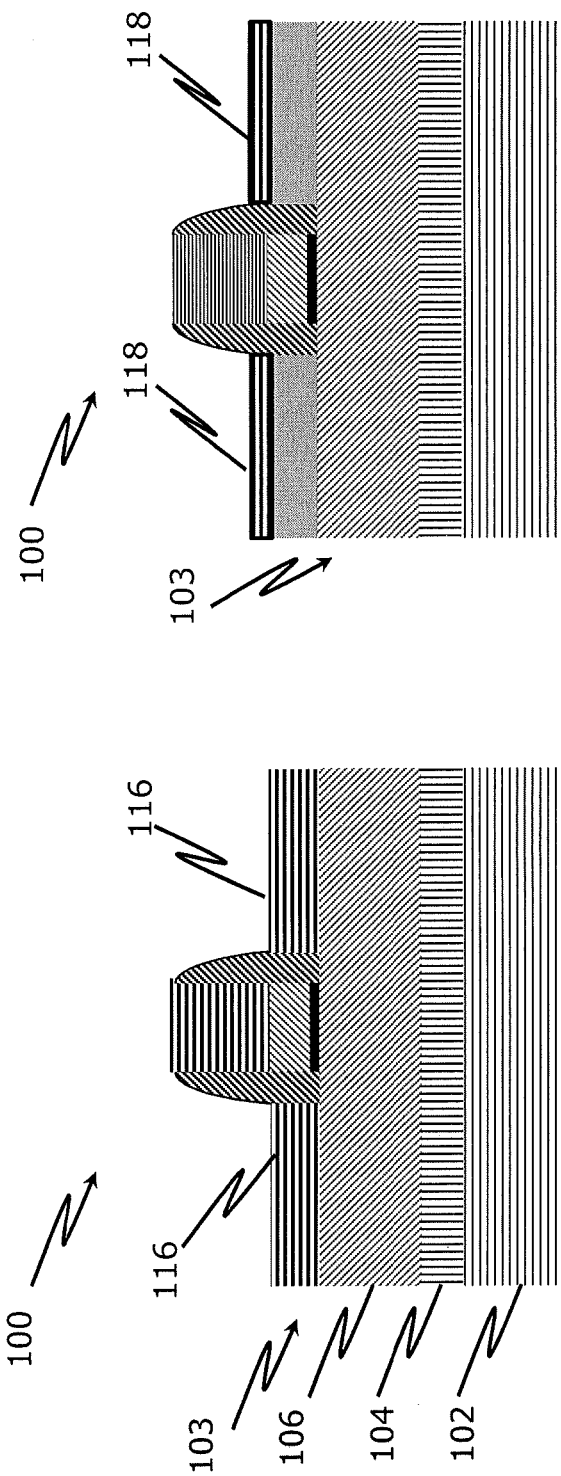

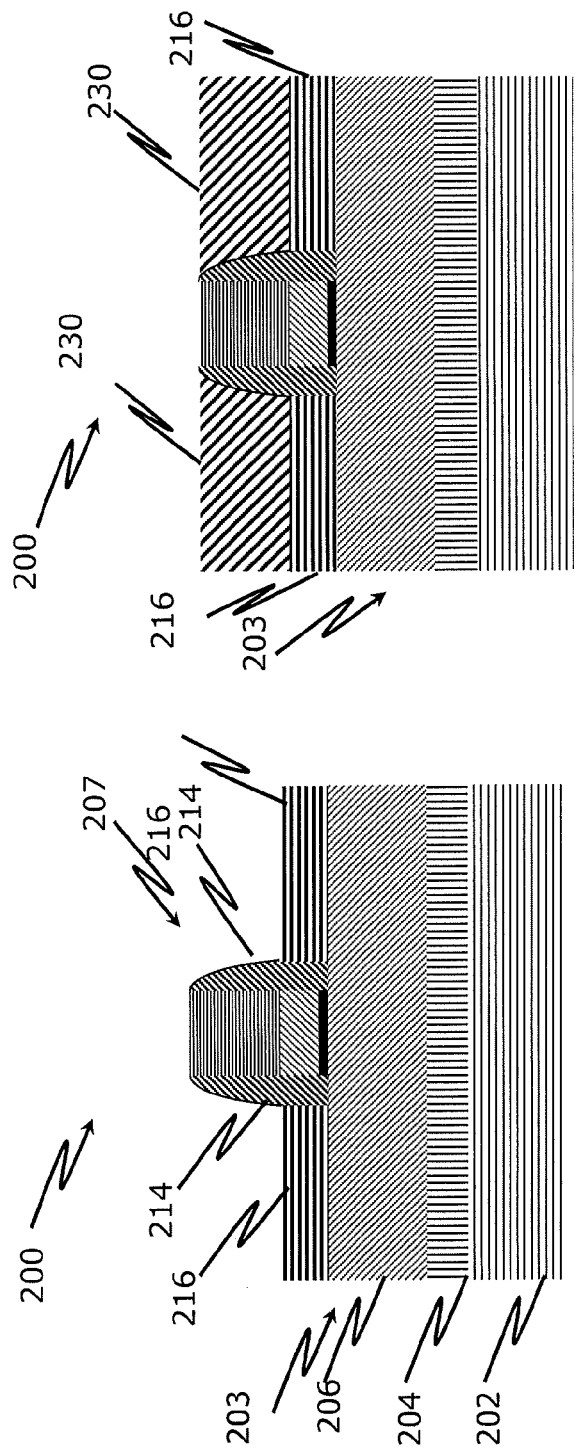

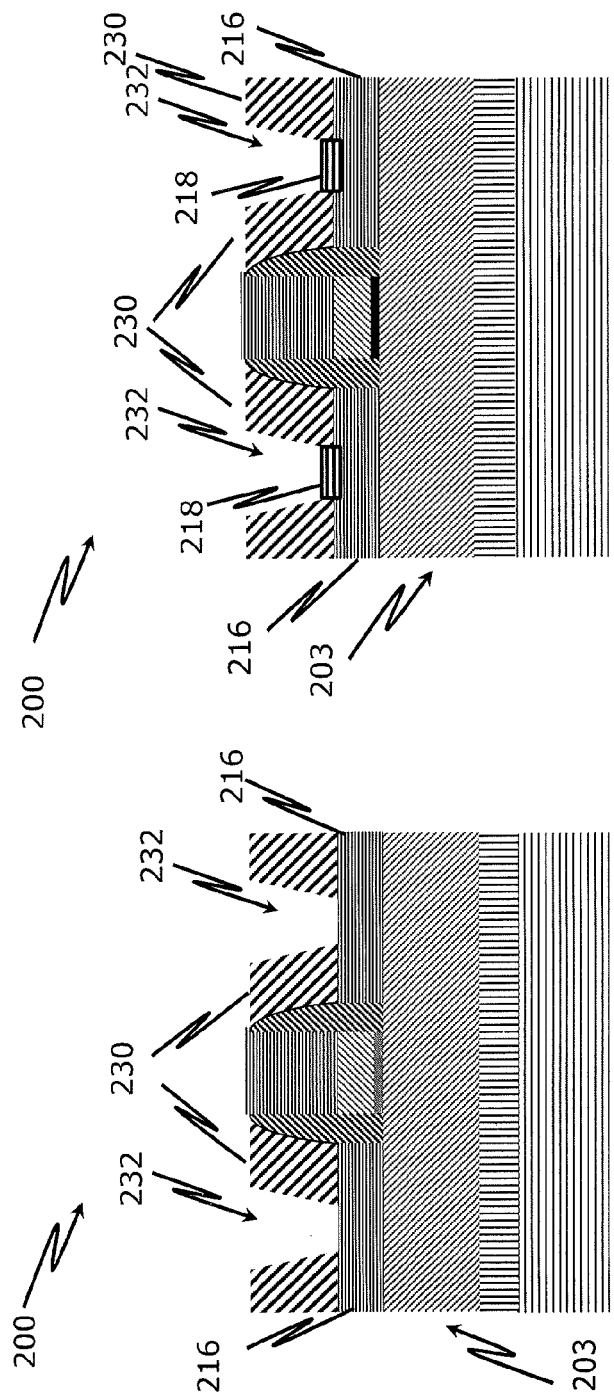

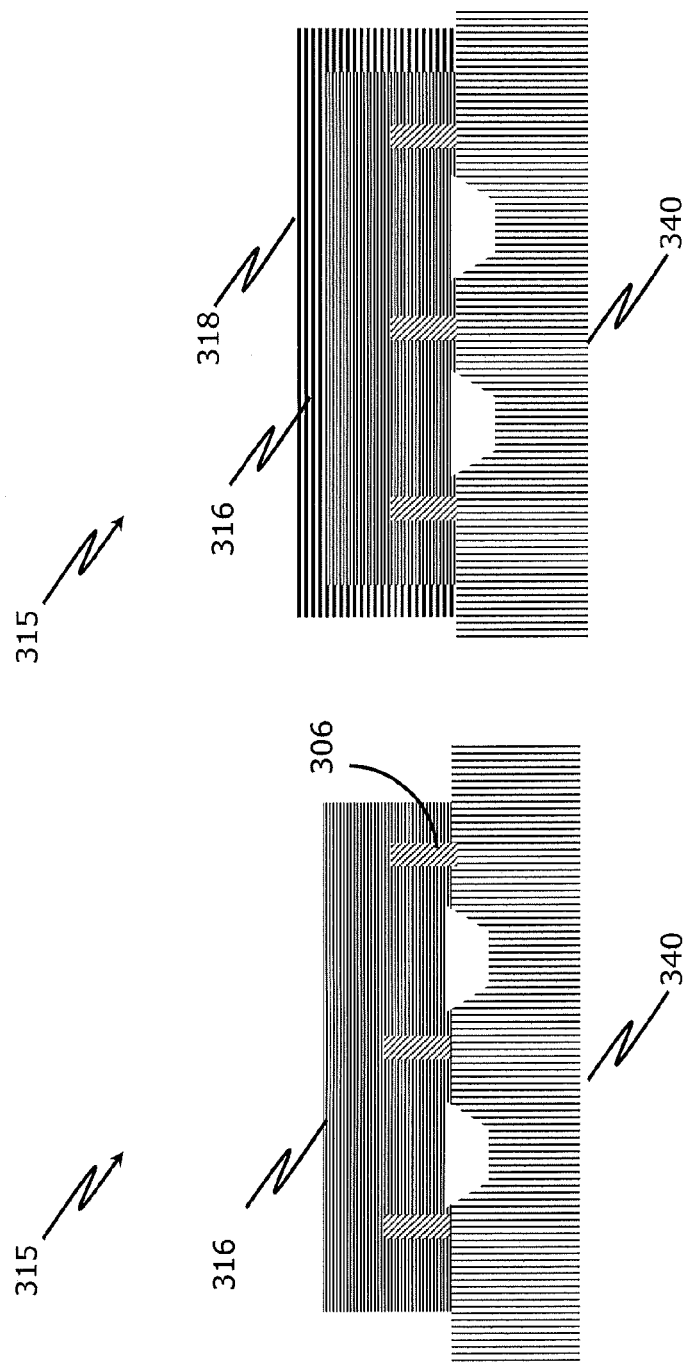

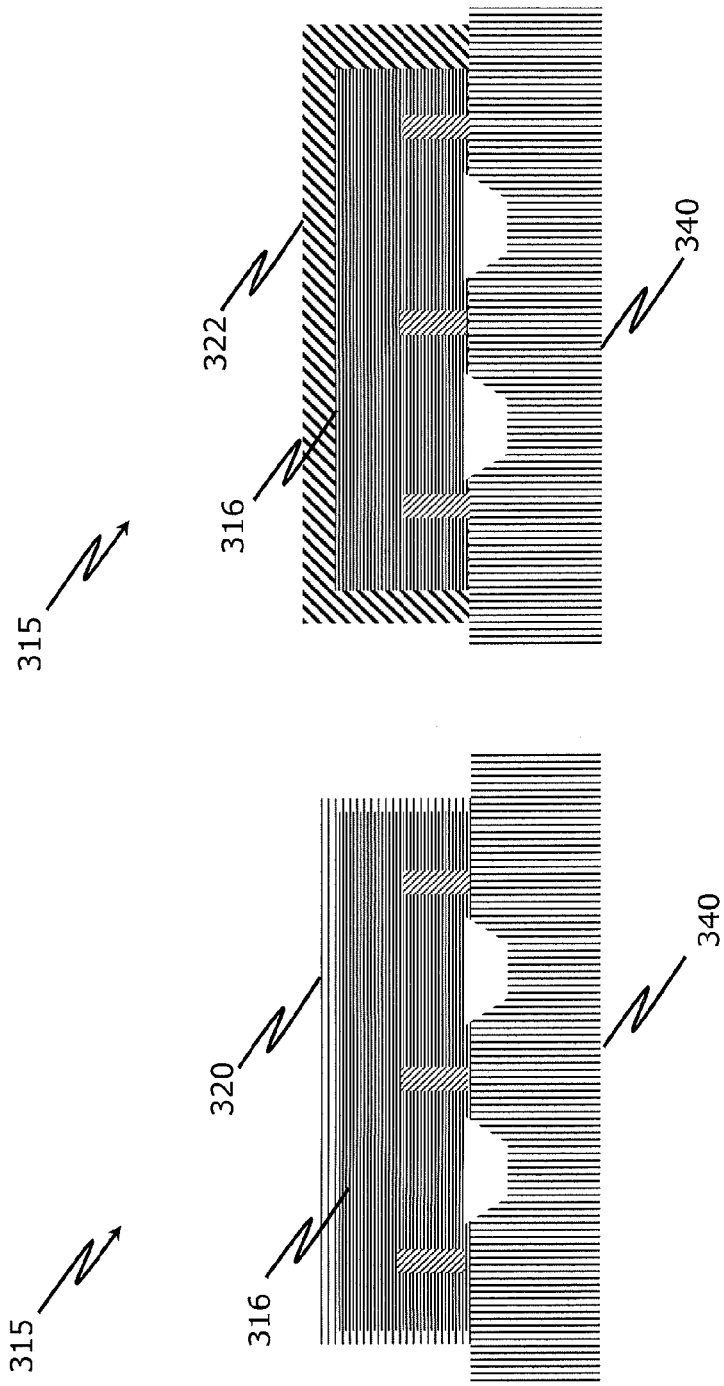

CONTACT RESISTANCE REDUCTION BY III-V GA DEFICIENT SURFACE

BACKGROUND

The present invention relates to semiconductor devices, and more specifically, to fabrication methods and resulting structures for III-V semiconductors.

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, leading to the fabrication of products with increased memory capacity. The drive for ever-more capacity, however, is not without issue. The necessity to optimize the power and performance of each device and tailoring to particular applications becomes increasingly significant. As demands to increase densities and reduce power consumption in transistor devices continue, new designs and fabrication techniques to achieve a reduced power consumption and enhanced efficiency are developed.

SUMMARY

According to an embodiment of the present invention, described herein is a method of forming a semiconductor device. The method includes forming a III-V semiconductor substrate, then forming a gate structure on the III-V semiconductor substrate, and forming a thin spacer surrounding the gate structure. The method also includes forming a source/drain junction with a first doped III-V material at an upper surface of the III-V semiconductor substrate and oxidizing a surface the first doped III-V material forming an oxidation layer. The method further includes removing natural oxides from the oxidation layer on a surface of the first doped III-V material to expose ions of the first doped III-V material at least at a surface of the source/drain, applying a second doping to the exposed ions to further increase a doping concentration of the first doped III-V material at least at a surface thereof, forming metal contacts at least at the second doped surface of the source/drain and then annealing the metal contact.

According to another embodiment of the present invention, described herein is a method of reducing metal contact resistance in a III-V type material, the method comprising forming a III-V semiconductor substrate and forming a junction with a first doped III-V material at an upper surface of the III-V semiconductor substrate The method also includes oxidizing a surface a first doped III-V material forming an oxidation layer, removing natural oxides from the oxidation layer on a surface of the a first doped III-V material to expose ions of the first doped III-V material, and applying a second doping to the first doped III-V material to increase a doping concentration of the first doped III-V material at least at a surface thereof and form a second doped III-V material. The method also includes forming metal contacts at least at a portion of the surface of the second doped III-V material and annealing the metal contact.

According to yet another embodiment of the present invention, described herein is a semiconductor device including a III-V semiconductor substrate with a gate structure formed on the III-V semiconductor substrate and a source/drain junction with a first doped III-V material at an upper surface of the III-V semiconductor substrate; the first doped III-V material having a portion with a higher doping concentration. The semiconductor device also includes a thin spacer surrounding the gate structure and disposed between the gate structure and the first doped III-V material and a metal contact formed at the portion with the higher doping concentration.

BRIEF DESCRIPTION OF THE DRAWINGS

FIG. 3 is a cross sectional view of a semiconductor fabrication in accordance with an embodiment depicting addition of a raised source/drain;

FIG. 4 is a cross sectional view of a semiconductor fabrication in accordance with an embodiment depicting adding an oxidation layer;

FIG. 7 is a cross sectional view of a a semiconductor fabrication in accordance with another embodiment;

FIG. 8 is a cross sectional view of a formation of an isolation layer in accordance with an embodiment;

FIG. 9 is a cross sectional view of formation of a trench in the isolation layer of FIG. 8;

FIG. 10 is a cross sectional view of a formation of an oxide layer in accordance with an embodiment;

FIG. 14 is a cross sectional view of source/drain fabrication in accordance with an embodiment;

FIG. 15 is a cross sectional view of source/drain fabrication with oxidation layer in accordance with an embodiment;

FIG. 16 is a cross sectional view of source/drain fabrication depicting a source drain with higher doping concentration in accordance with an embodiment;

FIG. 17 is a cross sectional view of source/drain fabrication depicting a source drain metallic contacts in accordance with an embodiment.

DETAILED DESCRIPTION

In the manufacture of integrated circuit devices, III-V type materials metal oxide semiconductor field effect transistors (MOSFETs) are generating significant interest in industry. III-V MOSFETs with Ni-III-V contacts or non-Ni metal contacts exhibit high series resistance due to high specific contact resistivity $\rho c$ at the metal or metal alloy to n-type III-V source/drain (SD) interface. The high $\rho_c$ occurs due to electrically-active doping concentration Nd on the order of $e^{19}$ cm$^{-3}$ in the n-type III-V SD regions. As a result, conventional doping techniques are not possible, and high temperature processes degrade as well as decompose III-V type materials. Therefore, to address these constraints and the high contact resistance, what is needed is a technique and manufacturing process to enhance electrically-active doping concentration at the top surface of the n-type III-V SD regions.

Described herein in the various embodiments are Type III-V MOSFET, specifically nFET structures with enhanced surface doping in III-V source/drain (SD) or raised SD regions, and a method for forming such structures. In the following description, numerous specific details are set forth, such as specific integration and material regimes, in order to provide a thorough understanding of the various embodiments. It will be apparent to one skilled in the art that embodiments can be practiced without these specific details. In other instances, well-known features, such as integrated circuit design layouts, are not described in detail in order to not unnecessarily obscure embodiments. Furthermore, it is to be understood that the various embodiments shown in the Figures are illustrative representations and are not necessarily drawn to scale.

Generally, the embodiments described herein can be suitable for high performance or scaled transistors for dense logic devices having low power applications. Hetero-epitaxial of high quality IIIV semiconductor is extremely promising due to its much higher channel electron mobility than Silicon.

Figure 1:
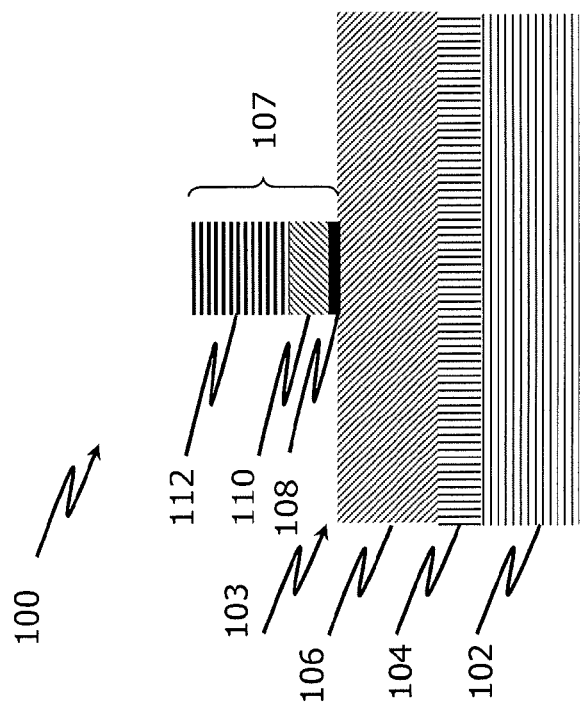
FIG. 1 is a cross sectional view of a semiconductor structure fabrication with a gate stack in accordance with an embodiment.

Turning now to a more detailed description of the embodiments, with reference to FIG. 1, a semiconductor structure 100 for fabrication of a III-V type material nFET is depicted. Group III-V materials include materials having at least one group III element and at least one group V element, such as, for example, one or more of aluminum gallium arsenide, aluminum gallium nitride, aluminum arsenide, aluminum indium arsenide, aluminum nitride, gallium antimonide, gallium aluminum antimonide, gallium arsenide, gallium arsenide antimonide, gallium nitride, indium antimonide, indium arsenide, indium gallium arsenide, indium gallium arsenide phosphide, indium gallium nitride, indium nitride, indium phosphide and alloy combinations including at least one of the foregoing materials.

Group III-V MOSFETs with Ni-III-V contacts or non-Ni metal contacts exhibit high series resistance due to high specific contact resistivity at the metal or metal alloy to n-type III-V source/drain (S/D) interface. The high resistivity occurs due to electrically-active doping concentration in the n-type III-V S/D regions. It is very difficult to increase incorporation of a dopant such as Si in III-V type material. Increased dopant by implantation fails due to amorphization of III-V materials and an inability to employ conventional high temperature doping processes which cause degradation of III-V material composition. Other conventional doping techniques such as in-situ Si doping on III-V materials has not proven adequate because after Si dopant concentration reaches 3e19 at/cm3, additional dopants are neither activated/absorbed by the material nor will it alter the composition of the III-V material. Therefore, to address this resistivity and ultimately high contact resistance, a method is described to enhance electrically-active doping concentration at the top surface of an n-type III-V FET in S/D regions. In particular those III-V materials including Ga.

FIGS. 1-6 illustrates cross-sectional views of intermediate structures involved in the III-V MOSFET fabrication in accordance with an embodiment, in particular, a III-V type nFET. FIG. 1 illustrates a cross-sectional view of a structure shown generally as 100. On an InP substrate 102, an InAlAs buffer layer 104 is first grown that is an isolation from InP substrate. The channel layer 106 is comprised of lightly P-doped InGaAs, InAlAs and InP layers and the dopant is typically silicon for nFET transistor. The substrate 102, buffer layer 104 and cap 106 can be grown using known deposition techniques, for example, physical vapor deposition (PVD), chemical vapor deposition (CVD), electrochemical deposition (ECD), molecular beam epitaxy (MBE) and more recently, atomic layer deposition (ALD) among others. In this instance the substrate 102, buffer layer 104 and cap are grown using metal oxide chemical vapor deposition (MOCVD).

A gate stack 107 is formed on the cap. The gate stack 107 comprising a dielectric layer 108, gate metal layer 110, and hard mask 112 is patterned above the channel 103. The gate stack 107 is formed by known conventional processes including deposition of a high-k dielectric layer 108 (e.g., hafnium oxide (HfO2)), one or more work function metals and barrier layers (not specifically shown), and a gate metal layer 110 (e.g., tungsten W). The gate metal 110 is etched back and a cap material 112 (e.g., silicon nitride (SiN)) is deposited as shown in the Figure. The gate stack 107 can also be formed with conventional techniques of forming a dummy gate, machining and etching to remove the dummy gate before depositing the high-K dielectric 108, metal layer 110 and hard mask 112. It should be understood that while a single structure 107 is depicted, an embodiment can include a plurality of gates to form a plurality of III-V transistor devices.

Figure 2:
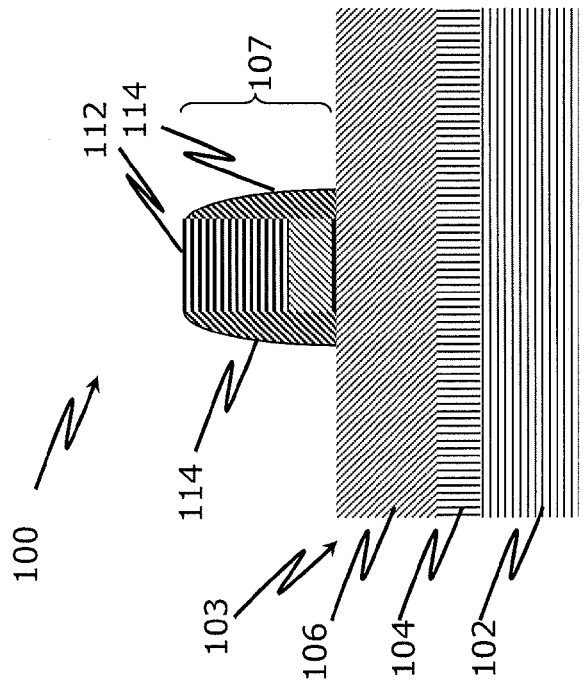
FIG. 2 is a cross sectional view of a semiconductor fabrication in accordance with an embodiment.

Sidewall spacers 114 are formed through a nitride spacer deposition (e.g., silicon nitride (SiN)) and reactive ion etch (RIE) process. It should be appreciated that the high-k dielectric layer 108 can alternately cover the sidewalls (inside of sidewall spacers 114), as well. Or as depicted in FIG. 2, additional etch can be used to remove any material from the sidewalls prior to deposition of the gate metal layer 110.

Turning now to FIG. 3 as well, a known process of epitaxially growing dual raised source/drain(s) (RSD) regions 116 (two are shown in the figure) is performed. The RSD 116 can be formed on the on the type III-V substrate material forming the channel 103 by a variety of methods, such as, for example, diffusion, ion implantation of a dopant into the substrate, or in-situ doped epitaxy. However, as mentioned previously, doping techniques for the III-V type materials are limited and the doping concentrations that can be achieved with conventional techniques are not sufficient to achieve desirable resistivity in the contacts for the RSD 116. In an exemplary embodiment the RSD 116 is formed by selectively growing Si doped InGaAs on the InGaAs channel 106. An in situ doping process with a Si dopant is employed. It should be well appreciated that while in an embodiment, Si doping has been identified, other dopants are possible. For example, Ge, Te, Sn, or Se could also be employed as dopants.

The surface to of the RSD 116 is then exposed to ozone to create an oxidation layer 118. The ozone oxidation can be accomplished by any conventional technique including a chamber, gas flow, or bath techniques. In an embodiment the structure 100 is exposed to ozone in a chamber to form the oxidation layer. The oxidation of the highly doped InGaAs produces many oxides for example, ($SiO_2$, $In_2O_3$, $Ga_2O_3$, $Ga_2O$, and $As_2O_3$ $As_2O_5$, $InAsO_4$, $GaAsO_4$). Many of these oxides are resistant to conventional etching processes employed for semiconductor manufacturing. However, some native oxides are not. In particular, the native oxides for Ga (and somewhat for In) are not and can be etched. Therefore, following an HF or HCL etching process, portions of the oxidation layer 118 remain, namely $In_2O_3$, $Ga_2O_3$, and $As_2O_3$. However predominately the $Ga_2O$ and to a lesser extent $In_2O_3$ has been removed and thereby exposed the Ga. While in an embodiment an etching removal process is described, other techniques that are known in the art can also be employed. For example, on technique is Plasma ion bombardment, such as with $H_2$, He, $N_2$, Ne, Ar, or $H_2$/He ions.

Figures 5, 6:
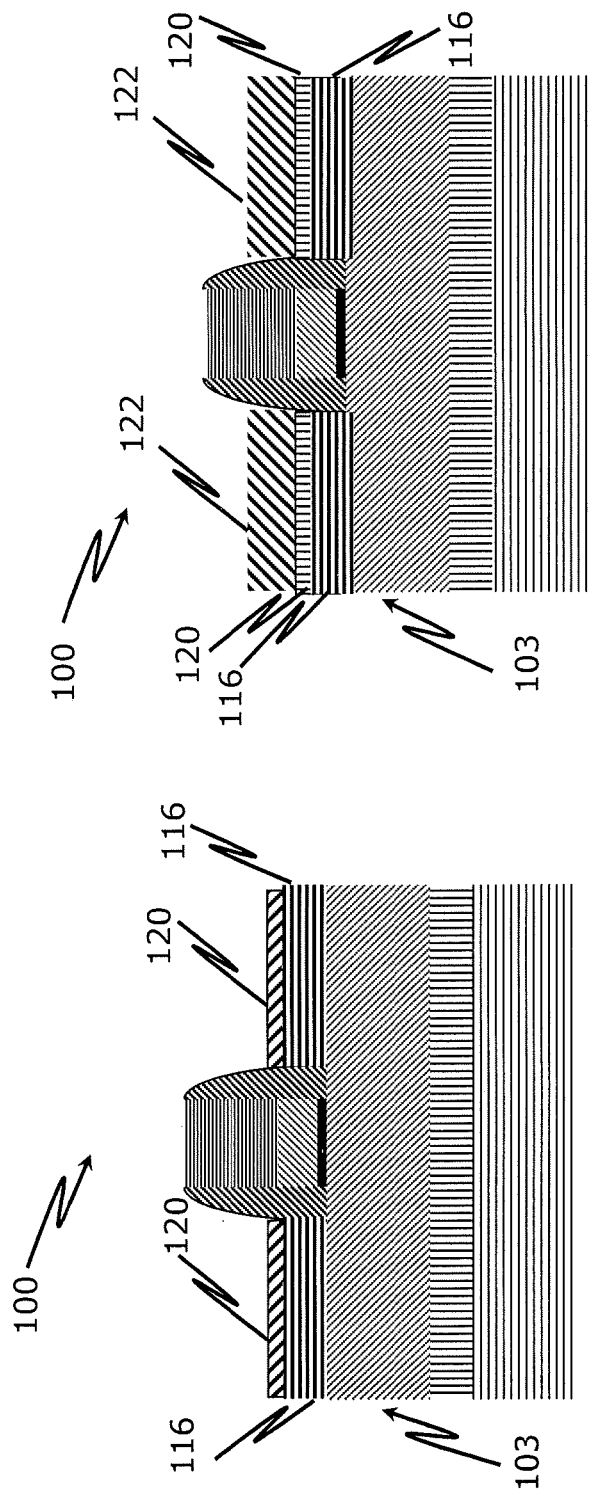
FIG. 5 is a cross sectional view of a semiconductor fabrication in accordance with an embodiment depicting a source drain with higher doping concentration.
FIG. 6 is a cross sectional view of semiconductor fabrication in accordance with an embodiment depicting a source drain with metal contacts.

Turning now to FIG. 5, RSD 116 and the oxidation layer 118 thereon, exhibiting the exposed Ga is now exposed to a Si doping. The doping can be accomplished using a plasma with a high Si concentration, or a low temperature thermal dissociation (e.g., on the order of no more than 600° C.). The exposed Ga+ ions of the RSD 116 are readily available to incorporate Si dopants. As a result, via the Si deposition via plasma or thermal reaction, the Si ions are made available to the Ga+ ions for incorporation as a dopant. The additional Si increases the doping concentration of the type III-V material depicted at 120, in this instance the selectively doped InGaAs used to for the RSD 116. As a result, the increased surface dopant concentration 120 achieves the goal of reducing the resistivity and thereby improving type III-V nFET contact resistance. It will be appreciated that the increased doping concentration as depicted by 120 occurs primarily at the surface of the RSD 116 and is a function of many factors. For example the dopant, the depth of the ozone oxidation 118, the depth of the etching process to expose the Gallium, and the characteristics of the doping. In an embodiment the depth is on the order of 5 nanometers. However, advantageously, the increase in doping concentration is sufficient to reduce the contact resistance as desired. Typically a reduction in resistivity in the RSD metal contact is on the order of 50% to 200%.

Finally, turning to FIG. 6, a metal contact 122 (e.g., Ti/Pd/Au or Ni/Ti/Au) is evaporated over the Si doped InGaAs (Si) surface to complete the fabrication of the RSD 116 in the type III-V nFET 100. The metal contact 122 can be deposited by many conventional techniques including, but not limited to know deposition or lithography techniques. In an embodiment a metal liftoff photo masking process is employed. Metal stack (Ti/Pd/Au or other metals) is evaporated onto patterned photomask which photoresist removal solution such as photoresist stripper or Acetone, is used as a result patterned metal lines remained. Following the placement of the metal contact 122, a standard low temperature annealing process is employed to improve the contact. In an embodiment, a conventional RTA annealing process (Rapid thermal anneal) on the order of 200° C. to 500° C. is employed.

Turning now to FIGS. 7-12 depicting cross sectional views of intermediate structures involved in the III-V MOSFET. In particular, a III-V nFET, fabrication in accordance with an embodiment with trench isolation type contact. FIG. 7 illustrates a cross-sectional view of a structure shown generally as 200 and corresponding III-V nFET fabrication of FIG. 3 incorporating the same initial processes as described earlier with reference to FIGS. 1-3. In this instance, the reference numerals have been increased by 100 for clarity. FIG. 7 depicts the structure following the formation of the gate stack 207, side wall spacers 214 and growing the raised source/drain(s) RSD regions 216 all employing processes and techniques as described earlier. Turning now to FIG. 8 as well, in an embodiment, an insulation layer 230 is built and processed on top of the RSD 216 employing conventional deposition techniques. For example, in some embodiments, the isolation layer 230 is deposited by a spin-on coating operation. In an embodiment the isolation layer 203 is deposited with chemical vapor deposition (CVD) process followed by a chemical-mechanical planarization to reduce it to an appropriate height. For example to the height of the gate stack 207. The insulation layer 230 can be of any suitable material, such as, for example, an oxide. In some embodiments, the insulation layer 230 is silicon dioxide (SiO2).

FIG. 9 depicts via holes or a trench 232 formed through the isolation layer 230 to expose the RSD 216. The via holes 232 are readily formed using any conventional removal process. In an embodiment, the via holes 232 are formed when patterned photomask is formed on the isolation layer 232. The patterned photomask exposes portions of the isolation layer 233 for selective removal via holes by a dry or wet etching process. In some embodiments, the via holes 232 are formed by a series of directional etches (e.g., RIEs). In some embodiments, an RIE selective to the isolation layer 230 removes exposed portions of the isolation layer 230 to expose a surface of the RSD 216.

Turning now to FIG. 10, Following the formation of the via holes 232 in the isolation layer 230, a portion of the RSD 216 is exposed. The structure 200 is now exposed to an ozone oxidation process to form an oxidation layer 218. Once again, the ozone oxidation can be accomplished by any conventional technique including a chamber, gas flow, or bath techniques as described earlier. In an embodiment the structure 200 is exposed to ozone in a chamber to form the oxidation layer. In particular, the native oxides for Ga (and somewhat for In) is not and can be etched. Likewise, as described above, following an HF or HCL etching process, portions of the oxidation layer 218 remain, namely $In_2O_3$, $Ga_2O_3$, and $As_2O_3$. However predominately the $Ga_2O$ and to a lesser extent $In_2O_3$ has been removed and thereby exposed the Ga.

Figures 11, 12:
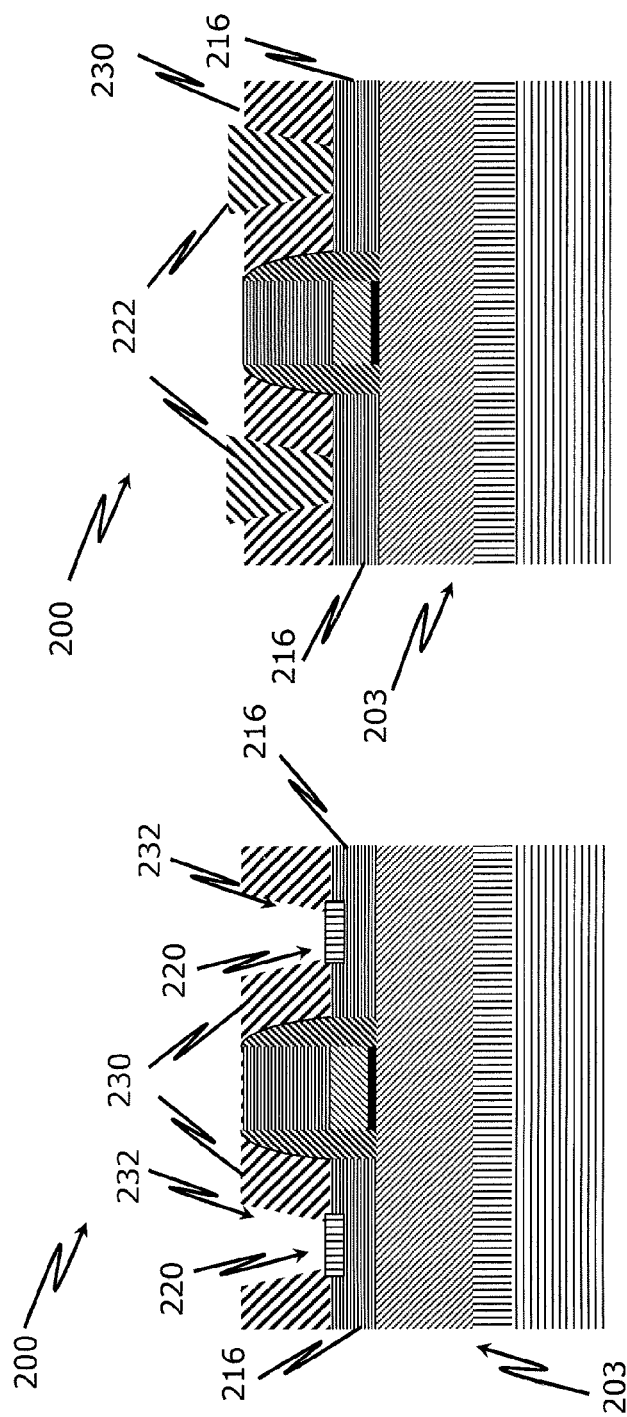
FIG. 11 is a cross sectional view of a semiconductor fabrication in accordance with an embodiment depicting a source drain with higher doping concentration.
FIG. 12 is a cross sectional view of a semiconductor fabrication in accordance with an embodiment depicting a source drain with metal contacts.

Turning now to FIG. 11 as well, the oxidation layer 218 exhibiting the exposed Ga following the HF or HCL etch is now exposed to a Si doping process. Once again, the doping can be accomplished using a plasma with a high Si concentration, or a low temperature thermal dissociation (e.g., on the order of no more than 600° C.). The exposed Ga+ ions of the RSD 216 are readily available to incorporate Si dopants. The additional Si increases the doping concentration of the type III-V material depicted at 220, in this instance the selectively doped InGaAs used to for the RSD 216. As a result, the increased surface dopant concentration 120 achieves the goal of reducing the resistivity and thereby improving type III-V nFET contact resistance. Once again, It will be appreciated that the increased doping concentration as depicted by 220 occurs primarily at the surface of the RSD 216 and is a function of many factors For example the dopant, the depth of the ozone oxidation 218, the depth of the etching process to expose the Ga, and the characteristics of the doping. In an embodiment the depth is on the order of 5 nanometers. However, advantageously, the increase in doping concentration is sufficient to reduce the contact resistance as desired. Typically a reduction in resistivity in the RSD metal contact is on the order of 50 to 200%

Finally, turning now to FIG. 12, a metal contact 222 (e.g., Ti/Pd/Au or Ni/Ti/Au) is evaporated over the Si doped InGaAs (Si) surface to complete the fabrication of the RSD 216 in the type III-V nFET 200. The metal contact 122 can be deposited by many conventional techniques including, but not limited to know deposition or lithography techniques. In an embodiment a metal liftoff photo masking process is employed. Following the placement of the metal contact 222, a standard low temperature annealing process is employed to improve the contact. In an embodiment, a conventional RTA annealing process on the order of 200° C. to 500° C. is employed.

Figure 13:
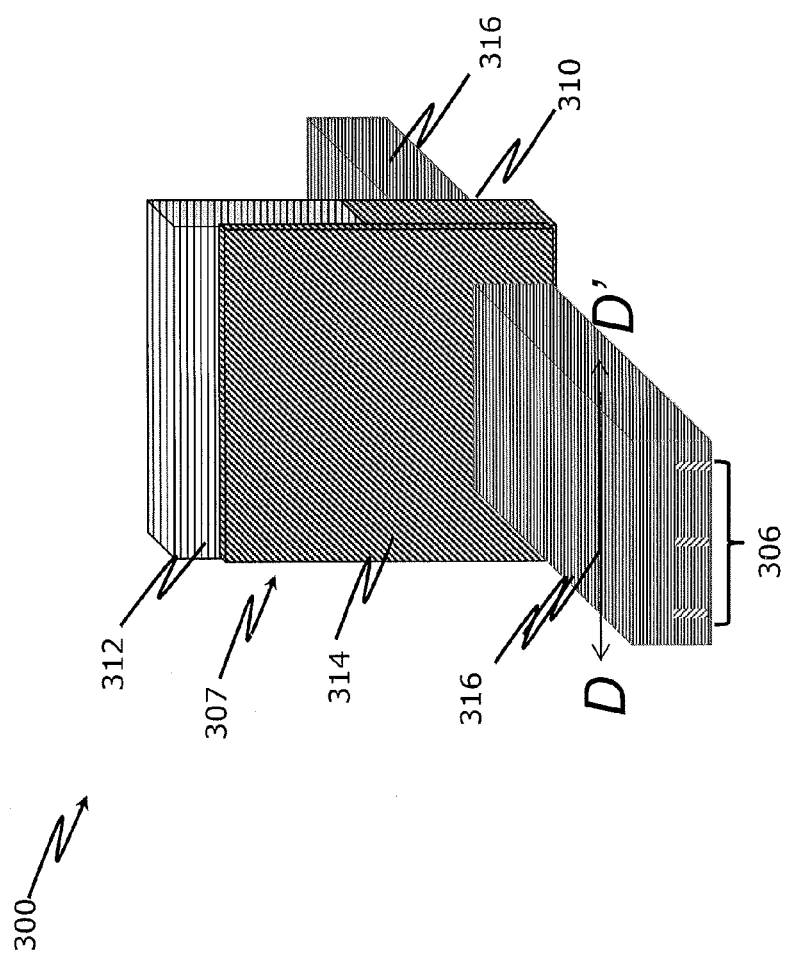
FIG. 13 is a perspective cross view of a formation of an III-V FINFET.

Turning now to FIGS. 13-17 depicting perspective and cross sectional views of intermediate structures involved in the III-V FINFET. In particular, a III-V type material nFINFET, fabrication in accordance with an embodiment is described. FIG. 13 illustrates a perspective view of a structure shown generally as 300 and corresponding III-V n-type FINFET with application of the techniques described herein to improve dopant and reduce contact resistance.

Once again the fabrication incorporates the same initial processes as described earlier with reference to FIGS. 1-6. In this instance, the reference numerals have been increased by 300 for clarity. Once again the fabrication includes the formation of a gate and spacer structure 307, and 314 similar in constitution and construction to that described earlier with respect to FIGS. 1-3 further detail is omitted for the sake of brevity. Continuing with FIG. 13, two source/drain regions (RSD) 316 are formed on each side of the gate structure 307 once again in a manner similar that already describe as is well known for the formation of a FINFET.

Turning now to FIG. 14 as well for further detail on the fabrication processes associated with the RSD 316. FIG. 14 depicts a cross sectional view of the RSD 316 as made through section D-D' and is shown generally as 315 In an exemplary embodiment the RSD 316 is formed by selectively growing Si doped InGaAs on an isolated substrate commonly known as a "box" 340, such as InAlAs very similar to the isolation layer 104 of earlier embodiments. An in situ doping process with a Si dopant is employed. Also grown on the box 340 is an InGaAs layer 306 over which the RSD 316 is formed. This material subsequently forms the channel 306 under the gate structure 307. The box 340 provides a surface for building the RSD 316 on and as an isolation layer. Turning now to FIG. 15 as well, as in embodiments as described earlier, the RSD 316 is exposed to ozone to form an oxidation layer 318. The oxidation layer 318 is subsequently exposed to a HF or HCL etch to once again remove the native oxides and expose the Ga in the RSD 316 as explained in detail with the earlier embodiments.

Looking to FIG. 16, RSD 316 and the oxidation layer 318 thereon, exhibiting the exposed Ga is now exposed to a Si doping. The doping can be accomplished using the methods described with earlier embodiments. As a result, via the Si deposition via plasma or thermal reaction, the Si ions are made available to the Ga+ ions for incorporation as a dopant. The additional Si increases the doping concentration of the type III-V material depicted at 320, in this instance the selectively doped InGaAs used to for the RSD 316. As a result, the increased surface dopant concentration 320 achieves the goal of reducing the resistivity and thereby improving type III-V nFET contact resistance. Now turning to FIG. 17, a metal contact 322 (e.g., Ti/Pd/Au or Ni/Ti/Au) is evaporated over the Si doped InGaAs (Si) surface to complete the fabrication of the RSD 316 in the type III-V nFET 300 and then completed with a standard low temperature annealing process to improve the contact. In an embodiment, a conventional RTA annealing process on the order of 200° C. to 500° C. is employed.

Figure 18:
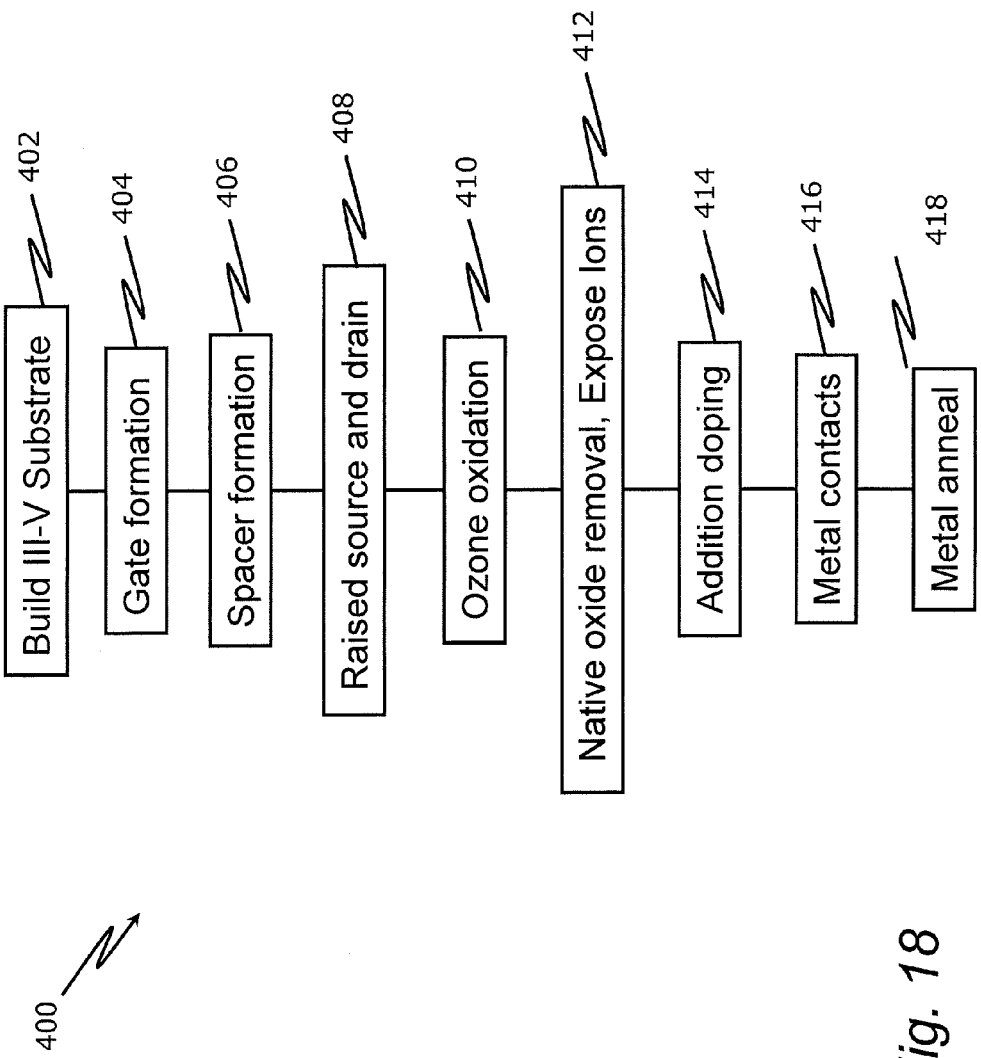
FIG. 18 is a block diagram depicting the method of reducing contact resistance in a III-V type material in accordance with an embodiment.

FIG. 18 depicts a block diagram of a method 400 of forming a III-V semiconductor transistor, in particular an n type FINFET in accordance with an embodiment. The method initiates with building a III-V type material substrate in accordance with the methodologies described herein as indicated at process step 402. The fabrication of a gate stack or structure is completed at process step 404. At process step 406 a spacer is formed around the gate stack. The spacer provides insulation between the gate stack and a raised source drain (RSD). The raised source/drain is built at process step 408. Depending on the construction configuration, this process step can also include forming an oxide layer over the RSD and then forming a trench through the oxide to expose the material of the RSD. An ozone oxidation as indicated by process step 410 is completed to create an oxidation layer on the surface of the RSD. At process step 412 native oxides from the oxidation step are removed, exposing ions from the III-V doped material of the RSD. Additional doping is applied at process step 414 to increase the doping concentration of the material forming the RSD. At process step 416 metal contacts are added to the RSD followed by an annealing process ant 418.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

The term "exemplary" is used herein to mean "serving as an example, instance, or illustration." Any embodiment or design described herein as "exemplary" is not necessarily to be construed as preferred or advantageous over other embodiments or designs. The terms "a", "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and IC fabrications are not described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
    forming a III-V semiconductor substrate;
    forming a gate structure on the III-V semiconductor substrate;
    forming a spacer surrounding the gate structure;
    forming a source/drain junction with a first doped III-V material at an upper surface of the III-V semiconductor substrate;
    oxidizing a surface the first doped III-V material forming an oxidation layer;
    removing natural oxides from the oxidation layer on a surface of the first doped III-V material to expose ions of the first doped III-V material at least at a surface of the source/drain;
    applying a second doping to the exposed ions to further increase a doping concentration of the first doped III-V material at least at a surface thereof;
    forming metal contacts at least at the second doped surface of the source/drain; and
    annealing the metal contacts.

2. The method according to claim 1, further comprising forming an oxide layer on top of the source/drain.

3. The method according to claim 2, further comprising removing a trench in the oxide layer to expose at least a portion of a surface of the first doped III-V material proximate to the oxide layer.

4. The method according to claim 2, wherein the oxide layer is formed with $SiO_2$.

5. The method according to claim 1, wherein the oxidizing is accomplished with ozone.

6. The method according to claim 1, wherein the removing is by HF or HCl etching.

7. The method according to claim 1, wherein the removing is by plasma ion bombardment.

8. The method according to claim 1, wherein the first doping is in situ.

9. The method according to claim 1, wherein the second doping is at least one or more of plasma doping followed by annealing processing, and low temperature thermal dissociation.

10. The method according to claim 1, wherein the doping concentration is increased by at least about 50%.

11. The method according to claim 1, wherein the III-V semiconductor is InGaAs.

12. The method according to claim 1 wherein the nFET transistor is at least one of a planar FET, trench FET, and FINFET.

13. A method of reducing metal contact resistance in a III-V type material, the method comprising:
    forming a III-V semiconductor substrate;
    forming a junction with a first doped III-V material at an upper surface of the III-V semiconductor substrate;
    oxidizing a surface a first doped III-V material forming an oxidation layer;
    removing natural oxides from the oxidation layer on a surface of the a first doped III-V material to expose ions of the first doped III-V material;
    applying a second doping to the first doped III-V material to increase a doping concentration of the first doped III-V material at least at a surface thereof and form a second doped III-V material;
    forming metal contacts at least at a portion of the surface of the second doped III-V material; and
    annealing the metal contacts.

14. The method according to claim 13, wherein the oxidizing is accomplished with ozone.

15. The method according to claim 13, wherein the removing is by HF or HCl etching.

16. The method according to claim 13, wherein the first doping is in situ.

17. The method according to claim 13, wherein the second doping is at least one or more of plasma doping followed by annealing processing, and low temperature thermal dissociation.

18. The method according to claim 13, wherein the doping concentration is increased by at least about 50%.

19. The method according to claim 13, wherein the III-V semiconductor is InGaAs.

* * * * *